(12) United States Patent
Willis

(10) Patent No.: US 10,978,598 B2
(45) Date of Patent: Apr. 13, 2021

(54) ELECTRO-OPTIC NANOSCALE PROBES

(71) Applicant: University of Connecticut, Farmington, CT (US)

(72) Inventor: Brian G. Willis, Storrs, CT (US)

(73) Assignee: University of Connecticut, Farmington, CT (US)

( * ) Notice: Subject to any disclaimer, the term of this patent is extended or adjusted under 35 U.S.C. 154(b) by 266 days.

(21) Appl. No.: 15/977,532

(22) Filed: May 11, 2018

(65) Prior Publication Data

US 2018/0331239 A1 Nov. 15, 2018

Related U.S. Application Data

(60) Provisional application No. 62/505,236, filed on May 12, 2017.

(51) Int. Cl.
| | | |
|---|---|---|
| *H01M 8/04* | (2016.01) | |
| *H01L 31/0224* | (2006.01) | |
| *H01L 31/108* | (2006.01) | |
| *H01L 31/09* | (2006.01) | |
| *H01L 31/08* | (2006.01) | |

(52) U.S. Cl.
CPC ...... *H01L 31/022408* (2013.01); *H01L 31/08* (2013.01); *H01L 31/09* (2013.01); *H01L 31/1085* (2013.01)

(58) Field of Classification Search
CPC . H01L 31/022408; H01L 31/08; H01L 31/09; H01L 31/1085
See application file for complete search history.

(56) References Cited

U.S. PATENT DOCUMENTS

| | | |
|---|---|---|
| 7,799,988 B2 | 9/2010 | Cutler |
| 8,299,655 B2 | 10/2012 | Cutler |
| 9,147,790 B2 | 9/2015 | Cutler |

OTHER PUBLICATIONS

Jiang et al., In-situ spectroscopic ellipsometry study of copper selective-area atomic layer deposition on palladium. J. Vac. Sci. Technol. A. 2014, 32, 041513, 11 pages. DOI: 10.1116/1.4884535.
Stolz et al., Nonlinear Photon-Assisted Tunneling Transport in Optical Gap Antennas. Nano Lett., 2014; 14(5):2330-2338 DOI: 10.1021/nl404707t.
Ward et al.,Optical rectification and field enhancement in a plasmonic nanogap. Nature nanotechnology. 2010; 5 (10):732-736. DOI: 10.1038/nnano.2010.176.

*Primary Examiner* — Jane J Rhee
(74) *Attorney, Agent, or Firm* — Michael Best & Friedrich LLP

(57) ABSTRACT

An antenna electrode including a first electrode that includes a core and a first conductive surface; a second electrode that includes a second conductive surface; and an electrical tunnel junction between the first conductive surface and the second conductive surface, the tunnel junction having a gap width greater than about 0.1 nm and less than about 10 nm.

20 Claims, 4 Drawing Sheets

(a)

(b)

(a) (b)

ELECTRO-OPTIC NANOSCALE PROBES

CROSS-REFERENCE TO RELATED APPLICATIONS

This application claims the benefit of U.S. Provisional Application No. 62/505,236 filed on May 12, 2017, which is herein incorporated by reference in its entirety.

STATEMENT REGARDING FEDERALLY SPONSORED RESEARCH

This invention was made with government support under Grant No. 1511138 awarded by the National Science Foundation. The government has certain rights in the invention.

FIELD OF INVENTION

The disclosure generally relates to high quality plasmonic nanostructures with antenna function combined with electrical response, and methods of producing the same. The nanostructures may be used in new types of electronic and photonic devices, photocatalysts, sensors, or energy harvesting devices, for example. The technology described in this disclosure could also be used in camera manufacturers, night vision glasses, infrared sensors, energy harvesting in the UV/visible/infrared, and applications for terahertz devices.

BACKGROUND

Currently, solar cells and semiconductor devices are used to achieve electronic and photonic functions. Although previous work has attempted to describe nanoscale optical rectification devices in theory, there is no established method to manufacture such designs. Hence, useful devices have never been made.

SUMMARY

In one aspect, the disclosure provides an antenna electrode including a first electrode that includes a core and a first conductive surface; a second electrode that includes a second conductive surface; and an electrical tunnel junction between the first conductive surface and the second conductive surface, the tunnel junction having a gap width greater than about 0.1 nm and less than about 10 nm.

In another aspect, the disclosure provides a method of manufacturing an antenna electrode including a first electrode that includes a core and a first conductive surface, a second electrode that includes a second conductive surface, and an electrical tunnel junction between the first conductive surface and the second conductive surface, the tunnel junction having a gap width greater than about 0.1 nm and less than about 10 nm, the method including: selectively depositing copper on the core by additive deposition to form the first conductive surface of the first electrode and the tunnel junction in the presence of the second electrode, the additive deposition does not substantially modifying the second conductive surface.

Other aspects of the disclosure will become apparent by consideration of the detailed description and accompanying drawings.

DETAILED DESCRIPTION

Figure 1:
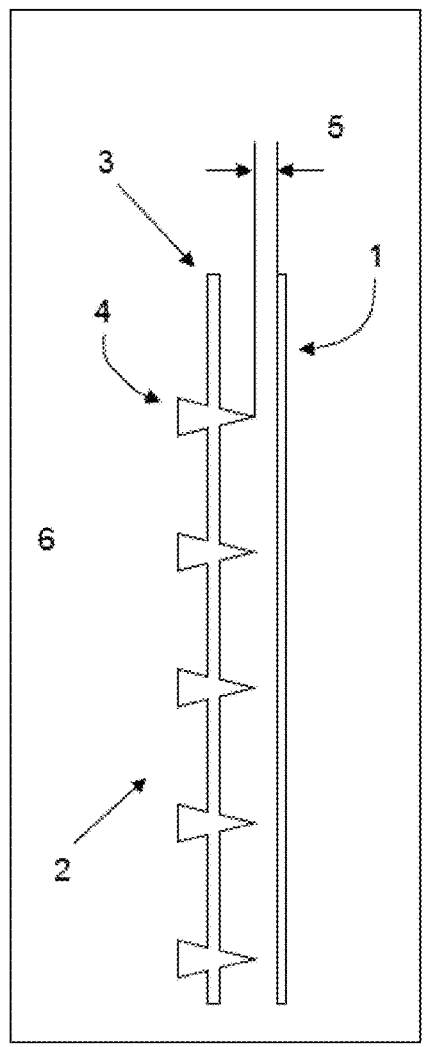
FIG. 1 illustrates an exemplary schematic of a selective additive method using two opposing antenna electrodes.
Figure 1:
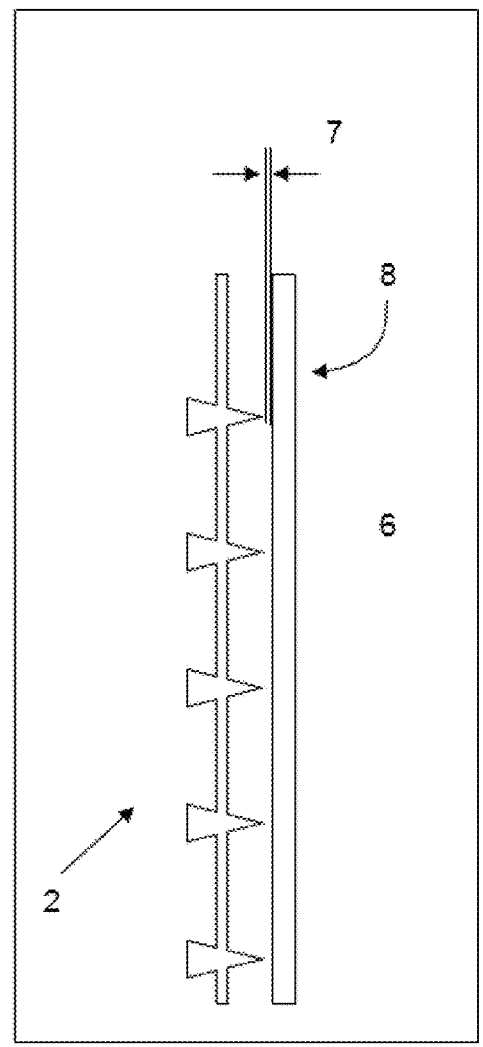

In the following detailed description, numerous details are set forth. It is to be understood that the disclosure is not limited in its application to the details of construction and the arrangement of components set forth in the following description or illustrated in the following drawings. The disclosure is capable of other aspects and of being practiced or of being carried out in various ways.

Unless otherwise defined, all technical and scientific terms used herein have the same meaning as commonly understood by one of ordinary skill in the art. In case of conflict, the present disclosure, including definitions, will control. Preferred methods and materials are described below, although methods and materials similar or equivalent to those described herein can be used in practice or testing of the present disclosure. All publications, patent applications, patents and other references mentioned herein are incorporated by reference in their entirety. The materials, methods, and examples disclosed herein are illustrative only and not intended to be limiting.

The terms "comprise(s)", "include(s)", "having", "has", "can", "contain(s)", and variants thereof, as used herein, are intended to be open-ended transitional phrases, terms, or words that do not preclude the possibility of additional acts or structures. The singular forms "a", "and", and "the" include plural references unless the context clearly dictates otherwise. The present disclosure also contemplates other aspects "comprising", "consisting of", and "consisting essentially of", the aspects or elements presented herein, whether explicitly set forth or not.

The modifier "about" used in connection with a quantity is inclusive of the stated value and has the meaning dictated by the context (for example, it includes at least the degree of error associated with the measurement of the particular quantity). The modifier "about" should also be considered as disclosing the range defined by the absolute values of the two endpoints. For example, the expression "from about 2 to about 4" also discloses the range "from 2 to 4". The term "about" may refer to plus or minus 10% of the indicated number. For example, "about 10%" may indicate a range of 9% to 11%, and "about 1%" may mean from 0.9-1.1. Other meanings of "about" may be apparent from the context, such as rounding off, so, for example "about 1" may also mean from 0.5 to 1.4.

The conjunctive term "or" includes any and all combinations of one or more listed elements associated by the conjunctive term. For example, the phrase "an apparatus comprising A or B" may refer to an apparatus including A where B is not present, an apparatus including B where A is not present, or an apparatus where both A and B are present. The phrase "at least one of A, B, . . . and N" or "at least one of A, B, . . . N, or combinations thereof" are defined in the broadest sense to mean one or more elements selected from the group comprising A, B, . . . and N, that is to say, any combination of one or more elements A, B, . . . or N including any one element alone or in combination with one or more of the other elements, which may also include, in combination, additional elements not listed.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated.

The term "substantially free", as used herein unless otherwise defined, is that a composition comprises less than about 5%, less than about 4%, less than about 3%, less than about 2%, less than about 1%, less than about 0.9%, less than about 0.8%, less than about 0.7%, less than about 0.6%, less than about 0.5%, less than about 0.4%, less than about 0.3%, less than about 0.2%, less than about 0.1%, less than about 0.05% or less than about 0.01% by weight of the indicated component.

The meaning behind an object being "not substantially modified" by additive deposition of a certain material, as used herein unless otherwise defined, is that an additive deposition process does not lead to a greater than 10%, 9%, 8%, 7%, 6%, or 5% increase in the size (e.g., surface area) of the object. Alternately or additionally, it may mean that there is not sufficient growth of the material on the object to cause noticeable structural changes of the object; that a functional property of the object is changed by less than 10%, 9%, 8%, 7%, 6%, 5%, 4%, 3%, 2%, 1%, or 0.1%; and/or that the object is substantially free of the deposition material.

For purposes of this disclosure, the chemical elements are identified in accordance with the Periodic Table of the Elements (CAS version) and the Handbook of Chemistry and Physics (98th Ed., inside cover).

Current electronic-photonic devices like cameras, solar cells, and optical/infrared sensors rely on semiconductor materials with band gaps to convert photons into electrons. For these materials, response sensitivity is non-uniform over the wavelength range of detection. Silicon can be used as a sensor for near infrared and visible radiation (less than about 1000 nm), but more exotic and expensive materials like germanium, mercury-cadmium-telluride, and compound semiconductors are required for operation in the infrared. By contrast, nanoscale antenna may be tuned to specific frequencies, and arrays with different sized antennas can function as sensors for different frequencies so that camera-like function or infrared sensing (e.g., night vision) could be achieved. Collections of antennas may be designed to give an overall flat response for sensitivity vs. wavelength, which can be advantageous for certain applications.

Nanoscale devices that couple electronic and optical functions to interconvert optical and electrical power have been theoretically described. Metallic nanostructures with dimensions near 10-250 nm made of materials such as Cu, Ag, Al, and Au have the ability to exhibit localized plasmonic resonances whereby incident optical radiation excites electron waves (plasmons) leading to strong absorption and scattering of radiation. The frequency and bandwidth of the interaction may be tuned from the ultraviolet through the visible to the infrared through design of conductive (e.g., metallic) nanostructures. Properly designed nanostructures may function like antennas, collecting electromagnetic energy from an area larger than their geometric structure. The frequency and efficiency of the nanostructures is dependent on the antenna design, materials, and packing of neighboring antenna into large arrays.

Such nanostructures could be deposited on low cost glass substrates and integrated with architectural elements, such as windows and building materials. There is potential for significant cost savings as well as new types of applications enabled by nanoscale antenna electrode structures. For example, it may be possible to modify automobile windows for night vision displays. Nanoscale antenna electrodes may also replace or enhance semiconductors for some applications, because they have electronic-photonic function that heretofore could only be achieved with semiconductor devices.

The basic concept of optical rectification has been demonstrated, but a practical working device has not been created. A reason that a working device has not been created until now is the difficulty to achieve precisely tuned tunnel junctions integrated with nanoscale antenna elements. Thus, it has been difficult to create diodes to convert radiation into electrical currents. The present disclosure concerns a means to overcome these significant process challenges to realize nanoscale antenna electrode devices.

It is well established that nanoscale antennas can interact with light, but to convert light to an electrical signal it is necessary to add an additional element: an electrical function such as an ultra-fast diode. The purpose of the ultrafast diode is to convert plasmon charge oscillations into electrical currents. Although the exact mechanism has not been fully described—the mechanism may involve hot electrons or holes with energy higher than the Fermi level that tunnel across an energy barrier—the antennas must be electrically coupled to electrical circuits through diodes that rectify electromagnetically-induced charge waves. Rectification elements allow currents to flow in one direction, so that net currents are extracted from the induced charge oscillations in the circuit. Nanostructures with strong geometric asymmetry may provide diode-like electrical characteristics without an applied bias. Alternately, a forward or reverse bias may be applied to direct the current flow into a non-linear regime with diode characteristics.

The combination of an antenna and diode is referred to as a "rectenna" or "nantenna." It may operate with or without an applied voltage bias. Plasmon resonances may enhance the charge oscillations, leading to larger electrical signals. Broadband response may be achieved by using a collection of differently sized antennas. Narrowband response may be achieved by using a singular type of antenna. If the efficiency is sufficiently high, solar or waste heat energy harvesting may be possible by conversion of electromagnetic radiation into electrical currents.

However, it is necessary to design high efficiency diodes that can respond to charge oscillations of the antenna at the very high frequency of the radiation. UV/visible/infrared frequencies of light are near $1\times10^{14}$-$1\times10^{15}$ Hz. Metal-vacuum-metal tunnel junctions may be the only devices that can respond at these frequencies and rectify light into DC electrical currents.

Diode function from a tunnel junction requires a preferred direction of electrical charge flow. This may be accomplished through geometric asymmetry. The concept is to have sharp needle-like tips opposing smooth surfaces. Sharp tips concentrate electric fields, thus leading to stronger electric fields near tips than compared to smooth surfaces. The difference in the electric field leads to a built-in voltage and net charge flow, analogous to the concept for solar cells or semiconductor photodetectors. Concentrated electric fields and diode properties also exist when a bias voltage is applied.

A tip may be considered "sharp" where, from a plain view perspective, it substantially has a shape that narrows to a point, such as a triangle. Alternately or additionally, a tip may be considered sharp if the narrowest portion of the tip (parallel to the plane of the substrate) has a length of less than or equal to about 100 nm, 90 nm, 80 nm, 75 nm, 70 nm, 65 nm, 60 nm, 55 nm, or 50 nm.

Sharp tip structures can be achieved through nanofabrication methods that use nanoscale lithography to pattern conductive nanostructures on planar substrates such as silicon wafers, silica wafers, or glass substrates. However, it is not possible with current methods to directly achieve nanostructures with reproducible tunnel junctions. The latter require nanometer sized gaps between nanoscale electrodes, which are impossible to achieve by conventional nanofabrication methods. The method of this disclosure, however, can achieve the required nanometer-size gaps to enable arrays of integrated tunnel junctions with nanoscale antenna electrode devices.

The method of this disclosure is, among other things, a process to fabricate nanostructured antenna electrode pairs. The gap between the nanoelectrodes forms a tunnel junction with very narrow separation on the order of nanometers.

In one aspect, sequential additive layers are applied onto pre-patterned antenna features. The nature of the additive process allows sub-monolayer control of the deposition, allowing 0.1 nm to 1 nm separations between electrodes to be achieved with the disclosed process. Such tiny separations enable tunneling currents to flow across narrow gaps between structures, and the applied electromagnetic fields create voltages across the junctions.

In another aspect, sequential additive layers of Cu are applied onto pre-patterned antenna features made of Pd. The nature of the atomic layer deposition process allows sub-monolayer control of the deposition, allowing 0.1 nm to 1 nm separations between electrodes to be achieved with the disclosed process. Such tiny separations enable tunneling currents to flow across narrow gaps between structures, and the applied electromagnetic fields create voltages across the junctions.

Cu—Pd interdiffusion when Cu is deposited on Pd yields smooth surfaces. The inventors have surprisingly discovered that Cu does not appreciably deposit on Au (i.e., the Au surface is not substantially modified by additive deposition of Cu). This knowledge enables fabrication of nanoelectrodes with sharp boundaries and strong plasmonic resonances with high quality factors. Thus nanoscale antenna made of materials such as Au, Ag, or Al can maintain sharp features and strong plasmonic properties during processing by additive deposition of Cu onto adjacent Pd surfaces.

When using only one material for both antenna electrodes, the additive layers tend to blunt sharp tips. In the case where the electrodes are initially predefined Pd and Cu is deposited by additive deposition, for example, there will be rounding and blunting of sharply defined features. The cause of the blunting is partly due to the uniform deposition of Cu layers on the sharply defined areas, which broadens tip regions as the Cu deposits nucleate into Cu layers. Thus, sharply defined tip radii are lost, and the asymmetric tunneling character for diode function is reduced.

Figure 3A:
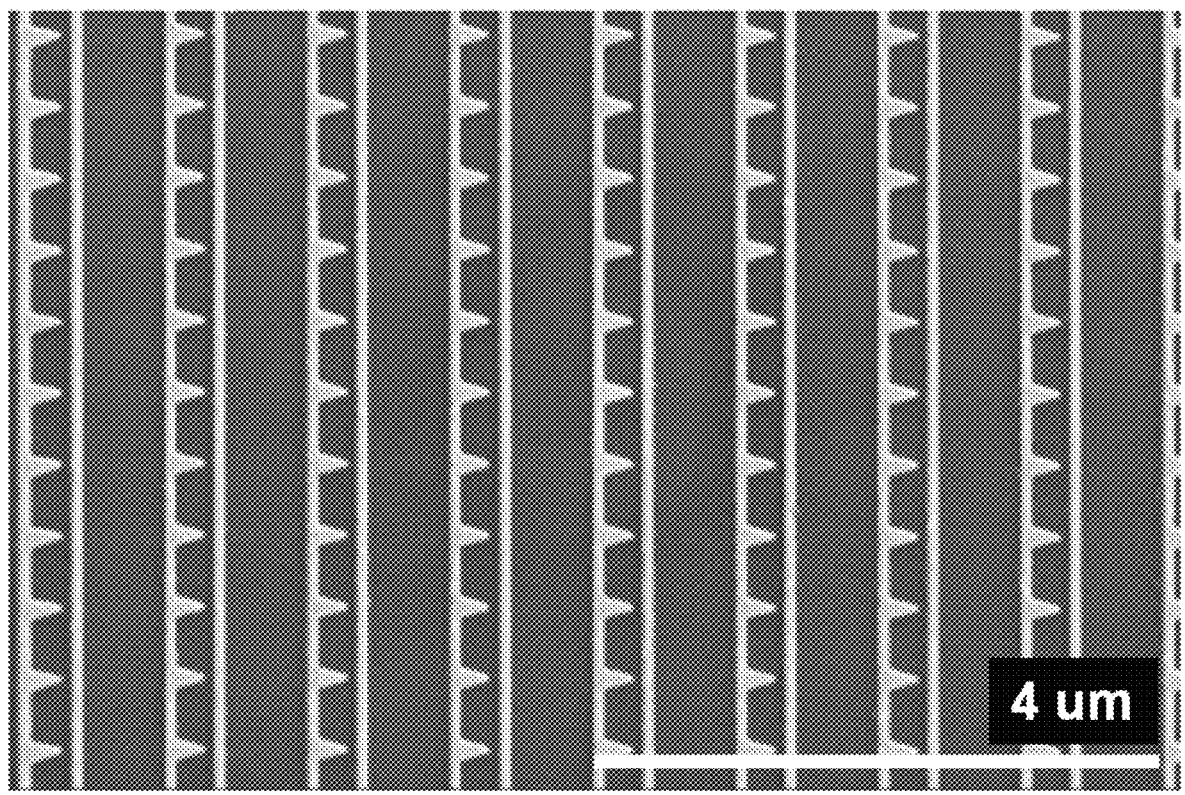
FIG. 3(a) illustrates a secondary electron microscope image of fabricated antenna electrode structures, such as those shown in the schematic of FIG. 1.
Figure 3B:
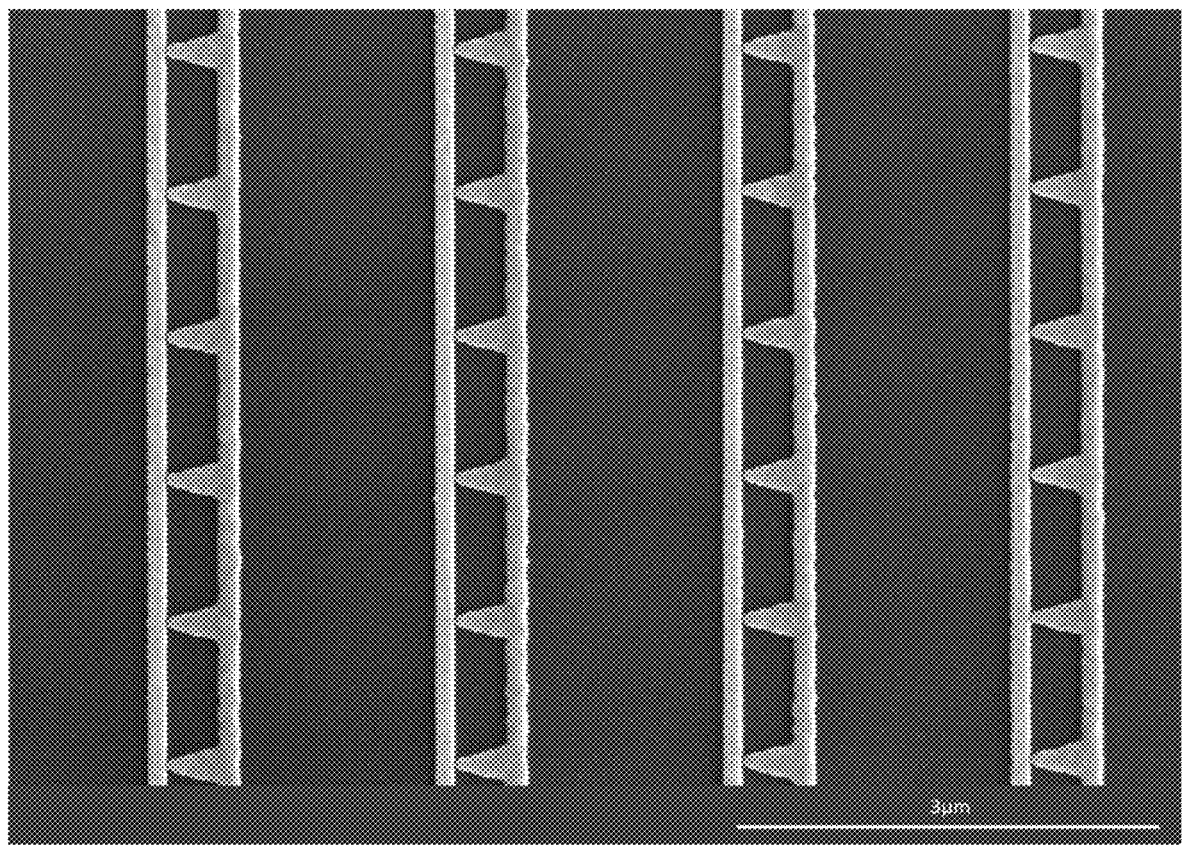
FIG. 3(b) illustrates another secondary electron microscope image of fabricated antenna electrode structures, such as those shown in the schematic of FIG. 1.

In one aspect, two separate materials are used in arrays of antenna electrode devices. Sharp tips are to be made of Au, Al, or Ag while predefined counter electrodes are made of Pd. In this aspect, Cu additive deposition occurs selectively on Pd layers, leaving gold nanostructures unmodified; i.e., still sharp as defined by nanolithography methods. The results of this process are depicted schematically by electron microscopy images in FIG. 3. FIG. 3 shows actual fabricated nanoscale antenna electrodes where one electrode is Au and the other is Cu additively deposited on Pd by atomic layer deposition. In this case, Au is used for the linear electrodes on the right-hand side of the image in FIG. 3(a), and Cu—Pd is on the left-hand side electrode with tip structures.

In another aspect, two separate materials are used to form two electrodes, such as Au and Pd, for example. In this way, sharp electrodes can be made of Au, while opposing electrodes can be made of Cu deposited on Pd. The disclosed additive process deposits Cu selectively on Pd surfaces, which allows nanogaps to be tuned to 0.1 nm to 1 nm precision. This process is illustrated in FIG. 1, in which view (a) illustrates antenna electrodes produced by a comparative example method and view (b) illustrates antenna electrodes produced by a method according to the present disclosure.

A first electrode 1 and a second electrode 2 are shown in FIG. 1(a). Electrode 2 includes features 3 and 4, which provide electrical connectivity and sharp features, respectively. In some applications, such as photocatalysis or photo stimulated processes, it may not be necessary or desirable to include the electrical connectivity feature 3. In some aspects, electrode 2 may be a material with a strong plasmonic response, such as Ag, Au, Al, Cu, an alloy thereof, or a mixture or combination thereof. Electrode 1 may be made of a material that enables additive deposition to alter the boundaries of the electrode.

For example, Pd can be selectively coated with Cu by atomic layer deposition. This method provides the necessary precision to control the additive deposition of Cu layers to create nanogaps with 0.1 nm to 1 nm precision. Additionally, the second electrode 2 and a region of substrate 6 will not be substantially covered or modified with additive layers; this is illustrative of selective deposition.

An initial gap 5 between the two electrodes in FIG. 1(a) is formed using conventional methods, such as nanoscale lithography, and may be in the range of about 10-100 nm. With the benefit of the disclosed method, the gap is reduced to about 0.5 nm to about 5 nm, which is schematically shown by gap 7 in FIG. 1(b). Electrode 1 is modified by the additive deposition process into a structure with expanded boundaries 8 in FIG. 1(b). During the additive process, electrode 2 is not significantly or substantially modified. Also, region 6 is not substantially modified by the additive deposition process.

Thus, the disclosed process accomplishes several tasks: 1) good plasmonic materials with strong response and antenna function are integrated with nanoscale electrode junctions; 2) sharply defined features of said antenna are not substantially modified during the deposition process; and 3) electrically conductive tunnel junctions are formed between electrodes 1 and 2.

Figure 2:
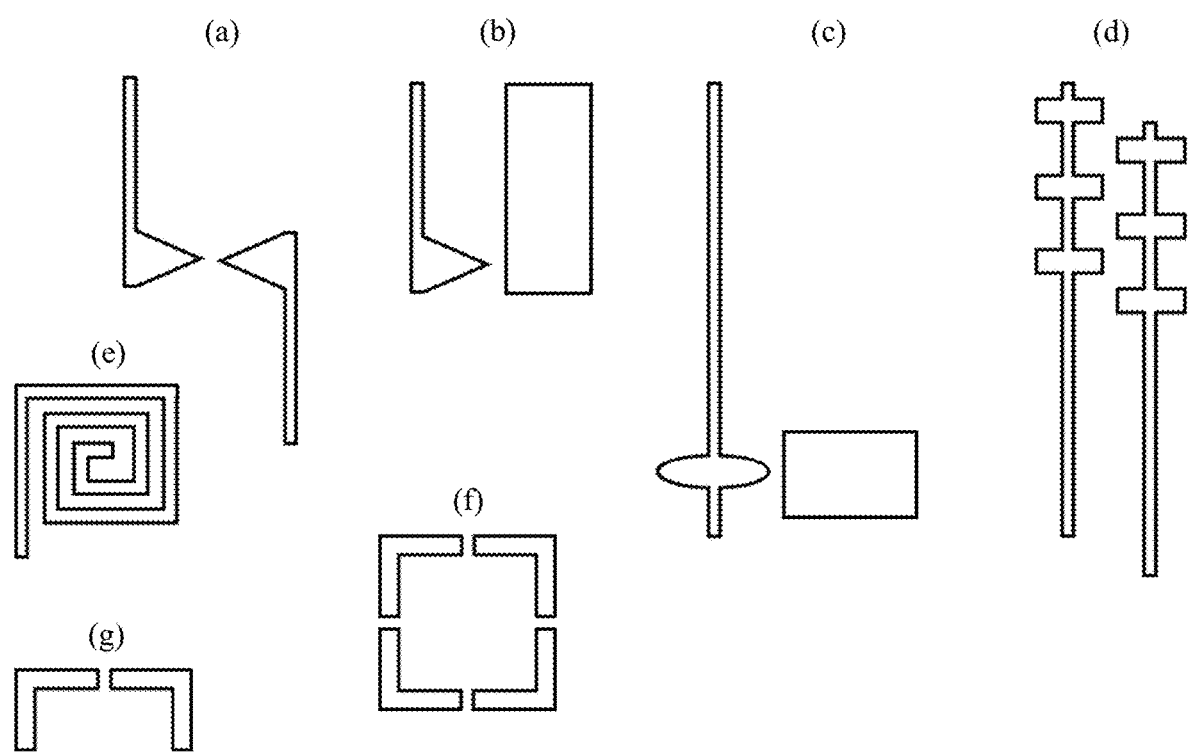
FIG. 2 illustrates exemplary antenna electrode designs.

The shapes of the electrodes are not limited to those shown in FIG. 1. Electrodes may have a myriad of shapes to tune the properties of the antenna and its plasmonic response, typically characterized by absorption and scattering of electromagnetic radiation as a function of wavelength. With the benefit of this disclosure, antenna of arbitrary design can be integrated with nanoscale electrical tunnel junctions. FIG. 2 exhibits some suitable antenna designs. The points of electrical contact may alter the optical properties of the nanoscale antennas.

Larger arrays of antennas can be created to take advantage of far field optical effects, such as constructive and destructive interference. Moreover, the design need not be limited to two electrodes; three, four, or more electrodes may be coupled by electrical tunnel junctions. In FIG. 1, for example, a third electrode including a second set of sharp tips similar to those forming electrode 2 could be positioned on the right-hand side, facing electrode 1.

Au, Al, and Ag are preferred materials for plasmonic effects. Thus, plasmonic resonances and device efficiency may be improved by changing from Cu—Pd antennas to Au, Al, or Ag antennas, because antenna quality and its optical properties are largely determined by the materials. Counter electrodes have a relatively smaller effect on device function, so a significant device performance gain may be realized by using two separate materials, such as Au combined with Cu—Pd. Other materials, such as TiN, may have further benefits.

However, there have conventionally been difficulties implementing two different materials in a nanofabrication process that integrates optical function and electrical tunnel junctions. The disclosed process solves these problems. The disclosed process to integrate two different materials may solve barriers to rectenna fabrication and lead to high efficiency devices that enable a new generation of electronic and photonic devices.

Additive deposition growth cycles may be repeated as many times as necessary to control the width of tunnel junction gaps between two or more electrodes. In some aspects, materials are chosen for their chemical properties to enable selective growth. For example, only one antenna electrode in a pair may adsorb hydrogen. Only the electrode that adsorbs hydrogen may undergo additive deposition, leaving the other electrode substantially unchanged or unmodified. In this way, a precise gap width may be controlled.

Atomic deposition may produce alloys between deposited materials and the predefined materials. For example, a predefined palladium electrode produced by lithography may be additively modified by atomic layer deposition with copper. In this case, the surface of the palladium electrode may be a palladium-copper alloy. In some aspects, the palladium-copper alloy may be copper-rich at the surface of the electrode. Other material combinations, such as Cu—Pt, may have similar characteristics, although the extent of alloy formation will be unique to each material combination. Alternately or additionally, selective additive deposition may be performed by other means, such as by chemical vapor deposition or electrochemical methods.

In some aspects, the disclosure may be an antenna electrode configuration comprising a first electrode including a copper-containing surface formed by atomic layer deposition on a hydrogen-adsorbing surface; a second electrode comprising a non-hydrogen-adsorbing surface (that is, a surface that does not appreciably adsorb hydrogen and/or is not substantially modified by hydrogen); and a tunnel junction between the copper-containing surface of the first electrode and the non-hydrogen-adsorbing surface of the second electrode, the tunnel junction having a narrow gap width. In an alternate aspect, the copper-containing surface may be made of a conductive material other than copper.

In one aspect, there is provided an electrode configuration comprising an insulating substrate, wherein a hydrogen-adsorbing surface is disposed on the insulating substrate. In another aspect, the insulating substrate may be a silicon, a silica, or another semiconductor wafer. Further still, the insulating substrate could be a carbon or a glass substrate.

In some aspects, the hydrogen-adsorbing surface described above may be palladium, platinum, rhodium, ruthenium, nickel, osmium, iridium, or an alloy thereof. In an alternate aspect, the hydrogen-adsorbing surface may be a different material. In yet other aspects, the additive deposition may occur by a different mechanism that does not require hydrogen adsorption.

In some aspects, the non-hydrogen-adsorbing surface described above may be gold, aluminum, silver, indium, copper, tungsten, molybdenum, tantalum, a conductive nitride, titanium nitride, tantalum nitride, tungsten nitride, a conductive carbide, titanium carbide, tungsten carbide, tantalum carbide, molybdenum carbide, any alloy thereof, a conductive polymer, carbon, a carbon nanotube, or some combination thereof. In some aspects, the non-hydrogen-adsorbing surface is a gold or silver surface. In another aspect, the non-hydrogen-adsorbing surface may be a different material.

In one aspect, the copper-containing surface is about 1 nm to about 100 nm thick (perpendicular to the plane of the substrate). In another aspect, the copper-containing surface may be any dimensions suited to the particular application.

In one aspect, one of the electrodes may comprises a plurality of sharp tips and tunnel junctions may have gap widths that extend between each sharp tip and the counter electrode(s).

In one aspect, the gap width of the tunnel junctions may be greater than about 0.1 nm and less than about 10 nm. In other aspects, the tunnel junction gap width may be greater than about 0.2 nm, about 0.3 nm, about 0.4 nm, about 0.5 nm, about 0.6 nm, about 0.7 nm, about 0.8 nm, about 0.9 nm, about 1 nm, about 1.5 nm, about 2 nm, about 2.5 nm, about 3 nm, about 3.5 nm, about 4 nm, about 4.5 nm, or about 5 nm. In some aspects, the tunnel junction gap width may be less than about 9.5 nm, about 9 nm, about 8.5 nm, about 8 nm, about 7.5 nm, about 7 nm, about 6.5 nm, about 6 nm, about 5.5 nm, or about 5 nm.

In one aspect, the additively modified surface may comprise an alloy of copper and the hydrogen-adsorbing surface.

In one aspect, additive deposition may utilize atomic layer deposition comprising pulsing with hydrogen and dosing with a copper reagent, as described by Jiang et al. *J. Vac. Sci. Technol. A*. 2014, 32, 041513, which method is incorporated by reference herein. For example, a surface of Pd may be populated by strongly adsorbed H* species generated after a $H_2$ gas pulse. During a subsequent dosing with $Cu^{II}$(bis(2,2,6,6,-tetramethyl-3,5-heptanedionate))$_2$ gas, the leading edge of the precursor pulse reacts with adsorbed H* to eliminate H-bis(2,2,6,6,-tetramethyl-3,5-heptanedionate) as the major byproduct and deposit Cu. Additional Cu(bis(2,2,6,6,-tetramethyl-3,5-heptanedionate))$_2$ adsorbs dissociatively onto the surface and desorbs during a subsequent He gas purge. The process may be repeated in a cyclical fashion.

In another aspect, the additive material may be tungsten or another conductive material with selective deposition properties.

In some aspects, the disclosure may be a member of a sensor, a rectenna, an infrared imaging device (e.g., night vision goggles), an ultra-fast diode, a field emission device, a probe, a photocatalyst, or any other suitable article.

In one aspect, the disclosure may be a method of manufacturing electrode configurations comprising selectively depositing copper on a hydrogen-adsorbing surface by atomic layer deposition to form a copper containing surface of a first electrode and a tunnel junction in the presence of a second electrode, wherein the atomic layer deposition does not substantially deposit copper on the non-hydrogen-adsorbing surface of the second electrodes.

In another aspect, the method may further comprise fabricating the predefined hydrogen-adsorbing surface by electron beam evaporation, thermal evaporation, electrochemical plating, electroless plating, or sputter deposition.

In yet another aspect, the copper may be deposited with a beta-diketonate, an acetamidinate, or bis(2,2,6,6,-tetramethyl-3,5-heptanedionate).

In yet another aspect, the method may not comprise etching away any material.

The present disclosure allows for a new class of nanoelectronic devices that uses conductive nanostructures and antennas to allow electro-optic function without a semiconductor. The devices could be made on low cost glass substrates, for example, and could have both cost and performance advantages. The disclosure allows for a new class of electronic-photonic devices with many possible applications. The disclosure may encompass new functionality for many different nanodevices ranging from light detectors to light emitters. It could replace costly semiconductor materials, especially for infrared applications. The disclosure may also have applications in photo-catalysis and photo-stimulated processes. The disclosure may have applications in sensors based on refractive index sensing, resistance modulation, Raman spectroscopy, or infrared spectroscopy, for example.

Various features and advantages of the disclosure are set forth in the following claims.

What is claimed is:

1. An antenna electrode comprising:
   (a) a first electrode comprising a core and a first conductive surface;
   (b) a second electrode comprising a second conductive surface; and
   (c) an electrical tunnel junction between the first conductive surface and the second conductive surface, the tunnel junction being configured to provide a path across which hot electrons or holes with energy higher than the Fermi level tunnel, the tunnel junction having a gap width greater than about 0.1 nm and less than about 10 nm.

2. An antenna electrode comprising:
   (a) a first electrode comprising a core and a first conductive surface;
   (b) a second electrode comprising a second conductive surface; and
   (c) an electrical tunnel junction between the first conductive surface and the second conductive surface, the tunnel junction having a gap width greater than about 0.1 nm and less than about 10 nm,
   wherein the core has a hydrogen-adsorbing surface, the first conductive surface is copper or an alloy of copper, and the second conducting surface is a non-hydrogen-adsorbing surface.

3. The antenna electrode of claim 1 further comprising an insulating substrate, wherein the first electrode is disposed on the insulating substrate.

4. The antenna electrode of claim 3, wherein the insulating substrate is a silicon wafer, silica wafer, semiconductor wafer, carbon substrate, or glass substrate.

5. The antenna electrode of claim 1, wherein the core is palladium, platinum, rhodium, ruthenium, nickel, osmium, iridium, or an alloy of any thereof.

6. The antenna electrode of claim 1, wherein the second conducting surface is gold, aluminum, silver, indium, copper, tungsten, molybdenum, tantalum, a conductive nitride, titanium nitride, tantalum nitride, tungsten nitride, a conductive carbide, titanium carbide, tungsten carbide, tantalum carbide, molybdenum carbide, an alloy of any thereof, a conductive polymer, carbon, a carbon nanotube, or a combination of any thereof.

7. The antenna electrode of claim 1, wherein the first conductive surface is about 1 nm to about 100 nm thick.

8. The antenna electrode of claim 1, wherein the second electrode comprises a plurality of sharp tips or edges and the gap width extends between each sharp tip or edge and the first electrode.

9. The antenna electrode of claim 1, wherein the first conductive surface comprises an alloy including copper and including a material of the core.

10. The antenna electrode of claim 1, wherein the first conductive surface is produced by additive deposition and the second conductive surface is not substantially modified by the additive deposition.

11. The antenna electrode of claim 10, wherein the additive deposition occurs by atomic layer deposition comprising pulsing with hydrogen and dosing with a copper reagent.

12. An ultraviolet, visible light, or infrared sensor comprising the antenna electrode of claim 1.

13. A rectenna comprising the antenna electrode of claim 1.

14. An ultra-fast diode comprising the antenna electrode of claim 1.

15. A field emission device comprising the antenna electrode of claim 1.

16. A probe comprising the antenna electrode of claim 1.

17. A photo-catalyst comprising the antenna electrode of claim 1.

18. A method of manufacturing an antenna electrode comprising a first electrode including a core and a first conductive surface, a second electrode including a second conductive surface, and an electrical tunnel junction between the first conductive surface and the second conductive surface, the tunnel junction being configured to provide a path across which hot electrons or holes with energy higher than the Fermi level tunnel, the tunnel junction having a gap width greater than about 0.1 nm and less than about 10 nm, the method comprising:
   selectively depositing copper on the core by additive deposition to form the first conductive surface of the first electrode and the tunnel junction in the presence of the second electrode, wherein the additive deposition does not substantially modify the second conductive surface.

19. The method of claim 18, further comprising fabricating a hydrogen-adsorbing surface of the core by electron beam evaporation, thermal evaporation, sputter deposition, electroplating, or electroless plating.

20. The method of claim 18, wherein the copper is deposited with a beta-diketonate, an acetamidinate, or bis(2,2,6,6,-tetramethyl-3,5-heptanedionate).

* * * * *